United States Patent
Blackshear

(10) Patent No.: US 9,040,388 B2
(45) Date of Patent: May 26, 2015

(54) CHIP ASSEMBLY WITH A CORELESS SUBSTRATE EMPLOYING A PATTERNED ADHESIVE LAYER

(71) Applicant: International Business Machines Corporation, Armonk, NY (US)

(72) Inventor: Edmund Blackshear, Wappinges Falls, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 97 days.

(21) Appl. No.: 13/768,759

(22) Filed: Feb. 15, 2013

(65) Prior Publication Data

US 2013/0157439 A1 Jun. 20, 2013

Related U.S. Application Data

(62) Division of application No. 12/878,579, filed on Sep. 9, 2010, now Pat. No. 8,378,498.

(51) Int. Cl.
*H01L 23/12* (2006.01)
*H01L 21/56* (2006.01)
(Continued)

(52) U.S. Cl.
CPC ........ *H01L 21/76254* (2013.01); *H01L 21/561* (2013.01); *H01L 21/6835* (2013.01); *H01L 23/3121* (2013.01); *H01L 24/81* (2013.01); *H01L 24/97* (2013.01); *H01L 2224/16227* (2013.01); *H01L 2224/73204* (2013.01);
(Continued)

(58) Field of Classification Search
CPC ................ H01L 2224/94; H01L 2221/68327; H01L 2224/27
USPC ........................................................ 438/458
See application file for complete search history.

(56) References Cited

U.S. PATENT DOCUMENTS 6,787,801 B2 9/2004 Fischer et al.
6,903,278 B2 6/2005 Sathe
(Continued)

OTHER PUBLICATIONS

Jadhav, V. et al., "Flip Chip Assembly Challenges Using High Density, Thin Core Carriers" IEEE Electronic Components and Technology Conference (2005) pp. 314-319.
(Continued)

*Primary Examiner* — Cathy N Lam
(74) *Attorney, Agent, or Firm* — Scully, Scott, Murphy & Presser, P.C.; Parashos T. Kalaitzis, Esq.

(57) ABSTRACT

A patterned adhesive layer including holes is employed to attach a coreless substrate layer to a stiffener. The patterned adhesive layer is confined to kerf regions, which are subsequently removed during singulation. Each hole in the patterned adhesive layer has an area that is greater than the area of a bottomside interconnect footprint of the coreless substrate. The patterned adhesive layer may include a permanent adhesive that is thermally curable or ultraviolet-curable. The composition of the stiffener can be tailored so that the thermal coefficient of expansion of the stiffener provides tensile stress to the coreless substrate layer at room temperature and at the bonding temperature. The tensile stress applied to the coreless substrate layer prevents or reduces warpage of the coreless substrate layer during bonding. Upon dicing, bonded stacks of a semiconductor chip and a coreless substrate can be provided without adhesive thereupon.

17 Claims, 12 Drawing Sheets

(51) Int. Cl.
*H01L 21/762* (2006.01)
*H01L 21/683* (2006.01)
*H01L 23/00* (2006.01)
*H01L 23/31* (2006.01)

(52) U.S. Cl.
CPC ............... *H01L2224/81001* (2013.01); *H01L 2224/83001* (2013.01); *H01L 2224/83102* (2013.01); *H01L 2224/92125* (2013.01); *H01L 2224/97* (2013.01); *H01L 2924/01033* (2013.01); *H01L 2924/014* (2013.01); *H01L 2224/16225* (2013.01)

(56) References Cited

U.S. PATENT DOCUMENTS

| | | | |
|---|---|---|---|
| 7,045,890 B2 | 5/2006 | Xie et al. | |
| 7,173,329 B2 | 2/2007 | Frutschy et al. | |
| 7,495,346 B2 | 2/2009 | Nakanishi et al. | |
| 7,666,714 B2 | 2/2010 | Lu et al. | |
| 7,670,962 B2 | 3/2010 | Huemoeller et al. | |
| 2005/0006744 A1 | 1/2005 | Ooi et al. | |
| 2008/0054490 A1 | 3/2008 | McLellan et al. | |
| 2008/0211143 A1* | 9/2008 | Morita | 264/510 |
| 2010/0073894 A1 | 3/2010 | Mortensen et al. | |
| 2012/0005887 A1* | 1/2012 | Mortensen et al. | 29/829 |
| 2012/0127689 A1* | 5/2012 | McLellan et al. | 361/820 |
| 2012/0326290 A1* | 12/2012 | Andry et al. | 257/680 |

OTHER PUBLICATIONS

Kumbhat, N. et al., "Novel Ceramic Composite Substrates for High-Density and High reliability Packaging" IEEE Transactions on Advanced Packaging (2007) pp. 641-653, col. 30(4).

* cited by examiner

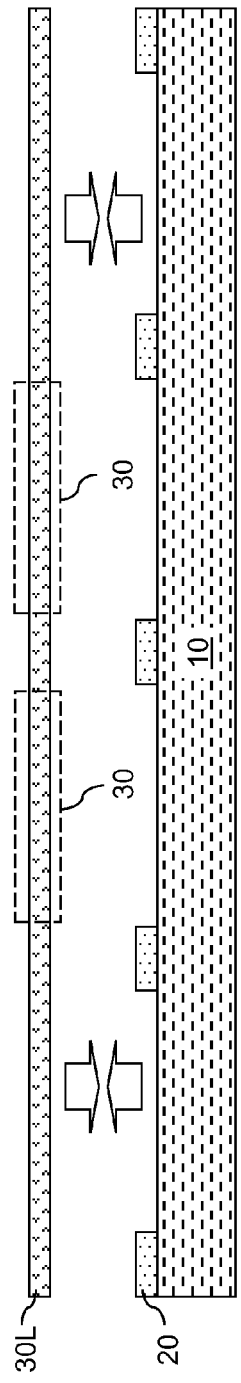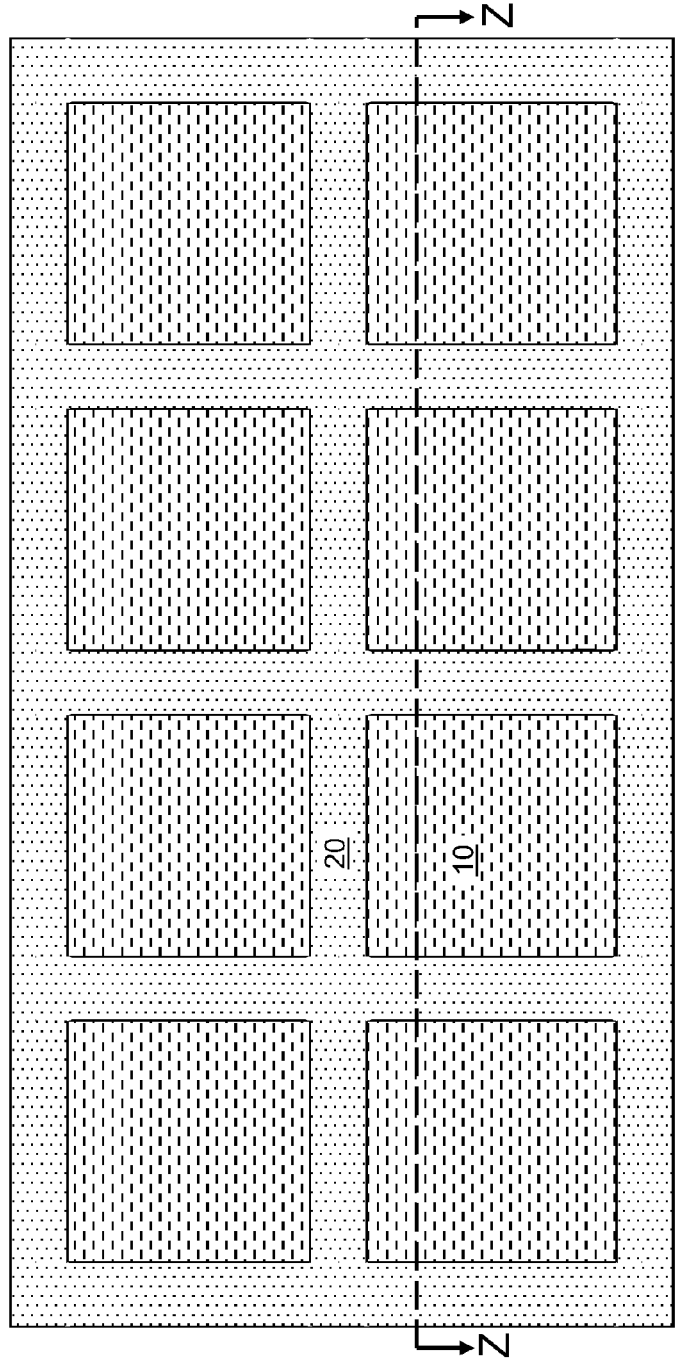

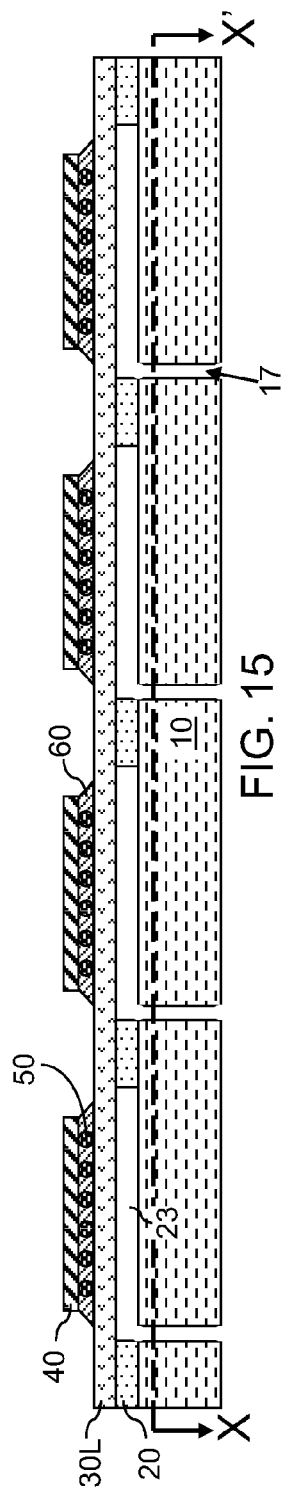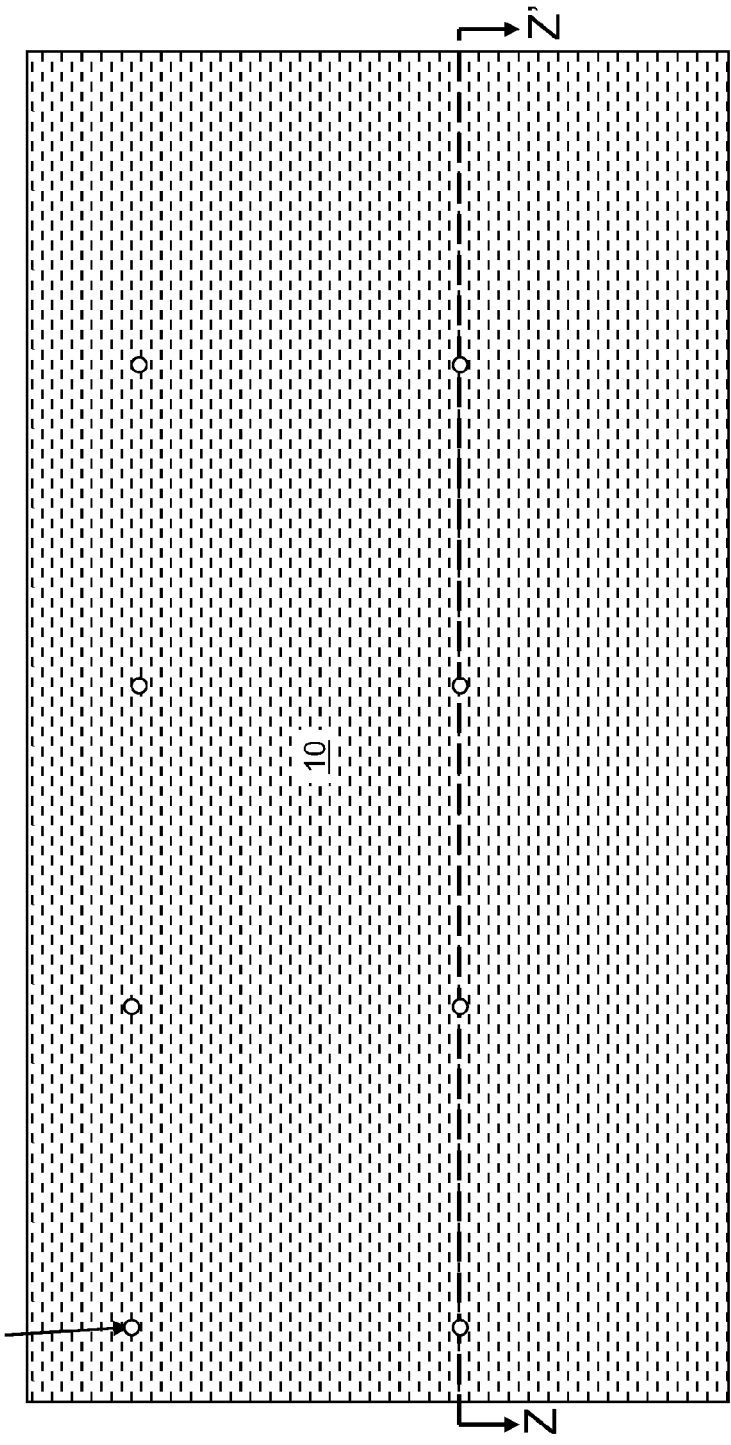

CHIP ASSEMBLY WITH A CORELESS SUBSTRATE EMPLOYING A PATTERNED ADHESIVE LAYER

CROSS REFERENCE TO RELATED APPLICATION

This application is a divisional of U.S. patent application Ser. No. 12/878,579, filed Sep. 9, 2010 the entire content and disclosure of which is incorporated herein by reference.

BACKGROUND

The present disclosure relates to a structure for chip assembly, and particularly to a method of assembling semiconductor chips with coreless substrates employing a patterned adhesive layer, and structures for effecting the same.

A coreless substrate is a substrate without a core, which includes a thick stiff material having enough mechanical strength to provide support for additional layers thereupon. Because of the lack of a core, a coreless substrate offers lower cost, enhanced wireability, and performance advantages over cored substrates, making them very attractive for packaging purposes.

However, the coreless substrate introduces additional difficulties during packaging. Specifically, coreless substrates warp during the assembly with a chip, which can be a semiconductor chip that is bonded to the coreless substrate through a flip chip assembly process. To alleviate the problem of warpage during the assembly, some solutions have been proposed in the art.

A first prior art method utilizes a dedicated clamp fixture which holds coreless substrates during assembly. While the clamp fixture may be reused for multiple coreless substrates, the clamp fixture must be adjusted not only for each coreless substrate size, but for temperature changes that are needed to bond chips to the coreless substrate. A second prior art method utilizes a removable planar adhesive layer applied to the entirety of the back side of a coreless substrate. A temporary stiffener is attached to the coreless substrate through the removable planar adhesive layer. The removal process for the "removable" planar adhesive layer after saw-singulation (dicing) can be difficult and time consuming. A third prior art method utilizes solder structures to provide temporary bonding between a coreless substrate and a stiffener. The third prior art method is time consuming and expensive due to the many processing steps required for attaching and detaching solder balls between the coreless substrate and the stiffener.

BRIEF SUMMARY

A patterned adhesive layer including holes is employed to attach a coreless substrate layer to a stiffener. The patterned adhesive layer is confined to kerf regions, which are subsequently removed during singulation, i.e., dicing, of the coreless substrate layer. Each hole in the patterned adhesive layer has an area that is greater than the area of a bottomside interconnect footprint of the coreless substrate. The patterned adhesive layer may include a permanent adhesive that is thermally curable or ultraviolet-curable. The composition of the stiffener can be tailored so that the thermal coefficient of expansion of the stiffener provides tensile stress to the coreless substrate layer at room temperature and at the bonding temperature. The tensile stress applied to the coreless substrate layer prevents or reduces warpage of the coreless substrate layer during bonding of semiconductor chips. Upon dicing, bonded stacks of a semiconductor chip and a coreless substrate can be provided without adhesive thereupon.

According to an aspect of the present disclosure, a structure includes: a coreless substrate layer including at least one coreless substrate integrally incorporated therein; a patterned adhesive layer including a plurality of holes therein and contacting a back side surface of the coreless substrate layer; a stiffener having a planar top surface that contacts the patterned adhesive layer; and a plurality of chips bonded to the coreless substrate layer. Each of the plurality of chips overlies one of the plurality of holes in the patterned adhesive layer. The interconnect footprint of each coreless substrate overlies an entirety of one of the plurality of holes in the patterned adhesive layer.

According to another aspect of the present disclosure, a method of forming a bonded stack of a coreless substrate and a chip is provided. The method includes: forming a stack, from bottom to top, of a stiffener, a patterned adhesive layer, and a coreless substrate layer including at least one coreless substrate integrally incorporated therein, wherein the patterned adhesive layer includes a plurality of holes therein; bonding at least one chip to said at least one coreless substrate; and dicing the coreless substrate layer to isolate at least one bonded stack of a coreless substrate and a chip along vertical planes that include a closed periphery that does not overlie any area of the patterned adhesive layer.

BRIEF DESCRIPTION OF THE SEVERAL VIEWS OF THE DRAWINGS

FIG. 1 is a vertical cross-sectional view of a first exemplary structure in which a coreless substrate layer is bonded to a patterned adhesive layer formed on a stiffener.

FIG. 2 is a top down view of the patterned adhesive layer located on a stiffener shown in FIG. 1 without showing the coreless substrate layer. The Z-Z' plane is the plane of the vertical cross-sectional view of FIG. 1.

FIG. 15 is a vertical cross-sectional view of a fifth exemplary structure at a processing step equivalent to the processing step of FIG. 5. The plane X-X' is a plane of the horizontal cross-sectional view of FIG. 16.

FIG. 16 is a horizontal cross-sectional view of the fifth exemplary structure of FIG. 15. The plane Z-Z' is a plane of the vertical cross-sectional view of FIG. 15.

DETAILED DESCRIPTION

Figure 3:
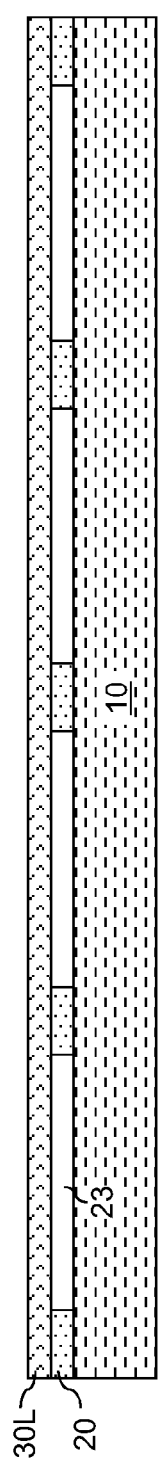
FIG. 3 is vertical cross-sectional view of the first exemplary structure after the coreless substrate layer is bonded to the patterned adhesive layer on the stiffener.

As stated above, the present disclosure relates to a method of assembling semiconductor chips with coreless substrates employing a patterned adhesive layer, and structures for effecting the same, which are now described in detail with accompanying figures. It is noted that like reference numerals refer to like elements across different embodiments.

Referring to FIGS. 1 and 2, a first exemplary structure according to the present disclosure includes a stiffener 10 and a patterned adhesive layer 20 formed on a top surface thereof. FIG. 1 is a vertical cross-sectional view along the vertical plane Z-Z' in FIG. 2, and FIG. 2 is a top down view of the assembly of the stiffener 10 and the patterned adhesive layer 20. A coreless substrate layer 30L is then bonded to the patterned adhesive layer 20. Alternately, the patterned adhesive layer 20 can be formed on the bottom surface of the coreless substrate layer 30L first, and the stiffener can be subsequently attached to the bottom surface of the patterned adhesive layer 20.

The coreless substrate layer 30L includes at least one coreless substrate 30, which can be a plurality of coreless substrates 30. Each of at least one coreless substrate 30 includes a first array of bonding pads (not shown) having a first pitch on a top surface, a second array of bonding pads (not shown) having a second pitch on a bottom surface, and metal interconnect structures (not shown) such as metal lines and metal vias electrically connecting the first array of bonding pads and the second array of bonding pads. The coreless substrate layer 30L does not include a core layer that includes a material providing sufficient mechanical strength to prevent bending or warping during bonding or dicing. Typically, a core layer is an epoxy-glass reinforced thick layer, which is typically at least 400 microns thick. Due to the absence of any core layer, the coreless substrate layer 30L is thinner than cored substrate layers that provide comparable functionality. The thickness of the coreless substrate layer 30L varies depending on the number of wiring levels embedded therein, which can be typically from 5 layers to 12 layers or more. Correspondingly, the thickness of the coreless substrate layer 30L can be from 250 microns to 600 microns, although thinner and thicker coreless substrate layers 30L can also be employed. In one embodiment, the functionality of each coreless substrate in the coreless substrate layer 30L can be tested prior to the attachment to the patterned adhesive layer 20. The testing ensures that a functional chip is not wasted by bonding to a non-functional coreless substrate.

The stiffener 10 includes a material having sufficient mechanical strength to prevent bending or warping of the coreless substrate layer 30L. In one embodiment, the stiffener 10 is sufficiently rigid and thick to maintain coplanarity of less than 1 micron per mm through a reflow process, which is performed during bonding of a semiconductor chip at a temperature exceeding 210 degrees Celsius. For example, the stiffener 10 can include a polymer or a composite material. The stiffener 10 is typically thicker than the coreless substrate layer 30L by a factor of 2~20. In one embodiment, the stiffener 10 is composed of a material having a glass transition temperature between 150 degrees Celsius and 210 degrees Celsius. Thus, the glass transition temperature of the stiffener 10 is between the bonding temperature at which semiconductor chips are subsequently bonded to the coreless substrate layer 30L and the dicing temperature, which is typically room temperature, i.e., a temperature between 15 degrees Celsius and 25 degrees Celsius. In one embodiment, the stiffener 10 can be composed of a polymer with a glass transition temperature similar to the glass transition temperature of the coreless substrate layer 30L if the coreless substrate layer 30L includes a material having a glass transition temperature.

In one embodiment, the material for the stiffener 10 is selected to provide lateral tensile stress to the coreless substrate layer 30L at the bonding temperature and at the dicing temperature. The stiffener 10 is composed of a material having a first temperature-dependent coefficient of thermal expansion. The coreless substrate layer 30L has a second temperature-dependent coefficient of thermal expansion that is functionally different from the first temperature-dependent coefficient of thermal expansion. The feature of application of lateral tensile stress by the stiffener 10 to the coreless substrate layer 30L at the bonding temperature and at the dicing temperature can be enabled by selecting the material of the stiffener such that the first temperature-dependent coefficient of thermal expansion is greater than the second temperature-dependent coefficient of thermal expansion of the coreless substrate above a cross-over temperature, and is less than the second temperature-dependent coefficient of thermal expansion below the cross-over temperature, and the cross-over temperature is between the bonding temperature and the dicing temperature. For example, the cross-over temperature can be at, or near, the glass transition temperature if the stiffener 10 is composed of a material having a glass transition temperature between 150 degrees Celsius and 210 degrees Celsius.

If the coreless substrate layer 30L includes a material having a glass transition temperature, the glass transition temperatures of the coreless substrate layer 30L and the stiffener 10 can be substantially matched, but the composition of the stiffener may be selected so that a desirable temperature-dependent differential between the first temperature-dependent coefficient of thermal expansion and the second temperature-dependent coefficient of thermal expansion can be achieved. As discussed above, the temperature-dependent differential can be positive below a cross-over temperature and positive above the cross-over temperature such that the cross-over temperature is between the bonding temperature and the dicing temperature, which is typically room temperature. In a non-limiting illustrative example, the stiffener 10 can be composed of epoxy resin or polyimide.

The patterned adhesive layer 20 includes a thermally curable adhesive material, an ultraviolet curable adhesive material, or a combination thereof. The patterned adhesive layer 20 can include a permanent adhesive material that is irreversibly cured under suitable conditions. The patterned adhesive layer 30L can be formed as a blanket layer contacting the entirety of the top surface of the stiffener 10 or the entirety of the bottom surface of the coreless substrate layer 30L. Subsequently, the patterned adhesive layer 30L, as uncured, is lithographically patterned and removed from areas over which semiconductor chips are to be subsequently bonded. Alternately, the patterned adhesive layer 20 can be formed as a patterned layer by applying an adhesive within a predefined region.

The area of the patterned adhesive layer 20 is confined within a kerf area, which is a complement of the chip areas, i.e., areas over which semiconductor chips are to be subsequently placed within the coreless substrate layer 30L. The patterned adhesive layer 20 has a constant thickness throughout. The thickness of the patterned adhesive layer 20 can be from 50 microns to 500 microns, although lesser and greater thicknesses can also be employed. In one embodiment, the patterned adhesive layer 20 is both ultraviolet curable and thermally curable, and the interface between the stiffener 10 and the patterned adhesive layer 20 (or the interface between the coreless substrate layer 30L and the patterned adhesive layer 20) is solidified by ultraviolet radiation, while not completely curing the patterned adhesive layer 20 to maintain adhesiveness on exposed surfaces of the patterned adhesive layer 20. The outer perimeter of the patterned adhesive layer 20 can be coextensive with the periphery of the stiffener 10 or with the periphery of the coreless substrate layer 30L.

Referring to FIG. 3, an assembly of the stiffener 10, the patterned adhesive layer 20, and the coreless substrate layer 30L is formed by bringing the exposed surface of the patterned adhesive layer either to the back side surface of the coreless substrate layer 30L or to the front side surface of the stiffener 10. The assembly is a stack, from bottom to top, of the stiffener 10, the patterned adhesive layer 20, and the coreless substrate layer 30L including at least one coreless substrate 30 integrally incorporated therein. The patterned adhesive layer 20 includes a plurality of holes 23 therein such that the area of the each hole 23 exceeds the area of a semiconductor chip to be subsequently bonded thereabove. As a stack, the stiffener 10, the patterned adhesive layer 20, and the coreless substrate layer 30L are assembled in a panel format at an assembly temperature, or a "lamination temperature," between the bonding temperature at which semiconductor chips are subsequently bonded to the coreless substrate layer 30L and the dicing temperature at which the coreless substrate layer 30L is subsequently diced.

In case the stiffener 10 and the coreless substrate layer 20 have coefficients of thermal expansion with a cross-over temperature as discussed above, the assembly temperature can be at or near the cross-over temperature. The assembly temperature is "near" the cross-over temperature if the two temperatures differ by less than 30 degrees Celsius. By selecting a material that provides a positive differential between coefficients of thermal expansion below a cross-over temperature and a negative differential between coefficients of thermal expansion above the cross-over temperature, the stiffener 10 can apply lateral tensile stress to the coreless substrate layer 30L at least at room temperature and at a bonding temperature, which is in a range between 210 degrees Celsius and 300 degrees Celsius. The patterned adhesive layer 20 is thermally cured after the assembly (10, 20, 30L) is formed in a panel format. In one embodiment, if the patterned adhesive layer 20 and the stiffener have glass transition temperatures, the assembly temperature can be at or near the glass transition temperature. The assembly temperature is "near" the glass transition temperature if the two temperatures differ by less than 30 degrees Celsius.

Figure 4:
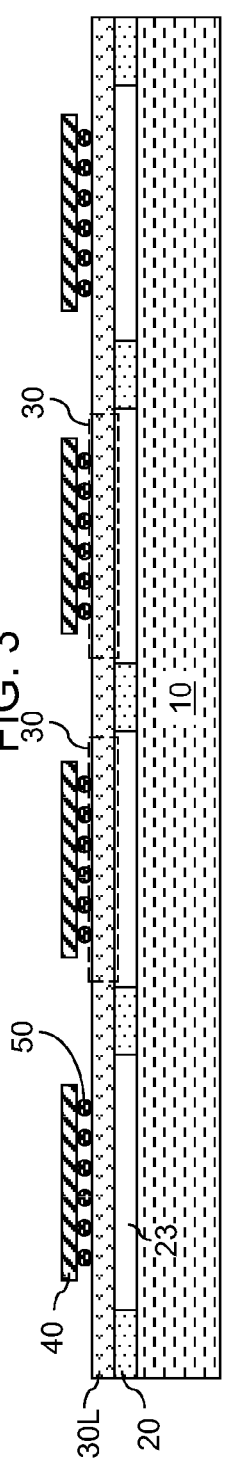
FIG. 4 is a vertical cross-sectional view of the first exemplary structure after bonding semiconductor chips to the coreless substrate layer.

Referring to FIG. 4, chips 40 are bonded to the coreless substrate layer 30L, for example, through C4 balls 50 that bond to the first array of bonding pads of each coreless substrate 30. The chips 40 can be semiconductor chips as known in the art, or may be any other type of chip that includes at least one electrical device and having bonding pads to which the C4 balls 50 can be bonded. The bonding of the chips 40 to the coreless substrates 30 can be performed at a bonding temperature, which is in the temperature range between 210 degrees Celsius and 300 degrees Celsius, employing methods known in the art. By selecting the material for the stiffener 10 to be able to provide lateral tensile stress to the coreless substrate layer 30L during the bonding, each coreless substrate 30 is maintained taut during the boding process. Thus, warpage and bending of the coreless substrates 30 are prevented during bonding of the plurality of chips 40.

Figure 5:
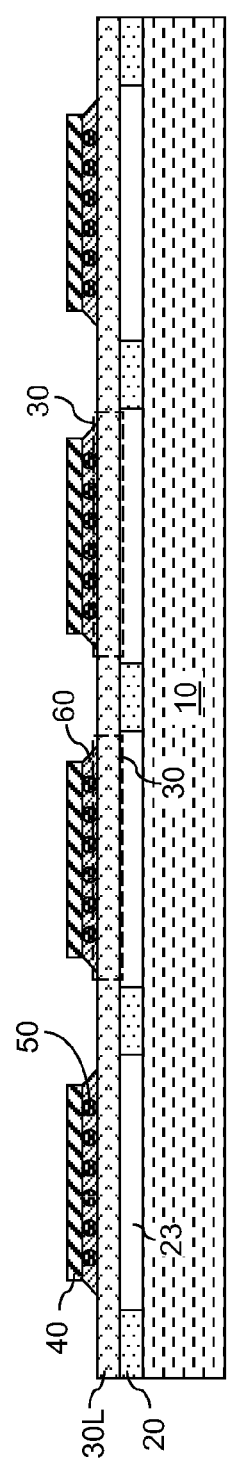
FIG. 5 is a vertical cross-sectional view of the first exemplary structure after applying underfills between the semiconductor chips and the coreless substrate layer.

Referring to FIG. 5, an underfill material is applied and cured to form an underfill 60 between each pair of chip 40 and an underlying coreless substrate 30. An underfill material has a low value of Young's modulus, and consequently, easily deforms under stress. The underfill 60 is employed to fill the space around the array of the C4 balls 50 between the chip 40 and the underlying coreless substrate 30. The underfill 60 absorbs the stress during the thermal expansion or contraction of the chip 40, the array of C4 balls 50, and the underlying coreless substrate 30, thereby preventing cracks in the bonded structure.

At this step, the first exemplary structure includes the coreless substrate layer 30L, which includes at least one coreless substrate 30 integrally incorporated therein, the patterned adhesive layer 20 including a plurality of holes 23 therein and contacting the back side surface of the coreless substrate layer 30L, a stiffener 10 having a planar top surface that contacts the patterned adhesive layer 20, and a plurality of chips 40 bonded to the coreless substrate layer 30L. Each of the plurality of chips 40 overlies an entirety of one of the plurality of holes 23 in the patterned adhesive layer 20. The plurality of chips 40 is bonded to the coreless substrate layer 30L through C4 balls 50. The stiffener 10 does not include any hole therein, and each hole 23 in the patterned adhesive layer 20 forms a sealed cavity. Each sealed cavity is bounded by the patterned adhesive layer 20, the coreless substrate layer 30L, and the stiffener 10. Further, each sealed cavity is present under each of the plurality of chips 40.

Figure 6:
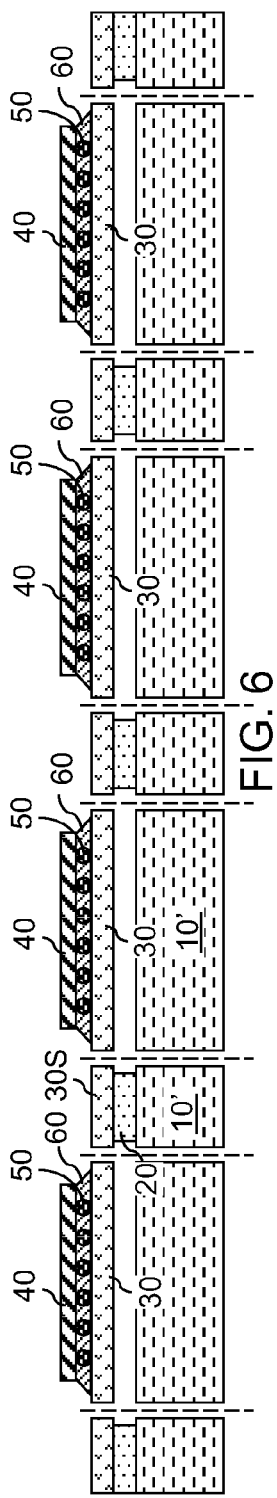
FIG. 6 is a vertical cross-sectional view of the first exemplary structure after dicing bonded stacks of a semiconductor chip and a coreless substrate employing a first dicing method.

Referring to FIG. 6, bonded stacks of a chip 40 and an underlying coreless substrate 30 as shown in FIG. 5 can be diced employing a first dicing method. In the first dicing method, the stiffener 10 is diced in a same dicing process as the coreless substrate layer 30L. The first exemplary structure of FIG. 5 is diced such that the plane of the dicing channel intersects the cavities in the patterned adhesive layer 20. The stiffener 10 is diced in the same pattern as the pattern of cuts made in the coreless substrate layer 30L. Specifically, the coreless substrate layer 30L and the stiffener 10 are diced to isolate at least one bonded stack (30, 40, 50, 60) of a coreless substrate 30 and a chip 40 along vertical planes that include a closed periphery that does not overlie any area of the patterned adhesive layer 20. Each closed periphery that does not overlie any area of the patterned adhesive layer 20 encircles the area of a single bonded stack (30, 40, 50, 60) of a coreless substrate 30 and a chip 40. Upon completion of dicing, no portion of each bonded stack (30, 40, 50, 60) of a coreless substrate 30 and a chip 40 contacts any remaining portion of the patterned adhesive layer 20. The stiffener portions 10', which are diced portions of the stiffener 10, are disjoined from the coreless substrates 30.

The dicing of the bonded stacks (30, 40, 50, 60) can be performed at a dicing temperature, which can be room temperature between 15 degrees Celsius and 25 degrees Celsius, or can be an elevated temperature or a refrigerated temperature as long as lateral tensile stress is applied to the bonded stacks (30, 40, 50, 60) during the dicing. By selecting the material for the stiffener 10 to provide lateral tensile stress to the coreless substrate layer 30L during the dicing process, each bonded stack (30, 40, 50, 60) is maintained taut during the dicing process. Thus, warpage and bending of the bonded stacks (30, 40, 50, 60) are prevented during the dicing of the plurality of bonded stacks (30, 40, 50, 60).

Figure 7:
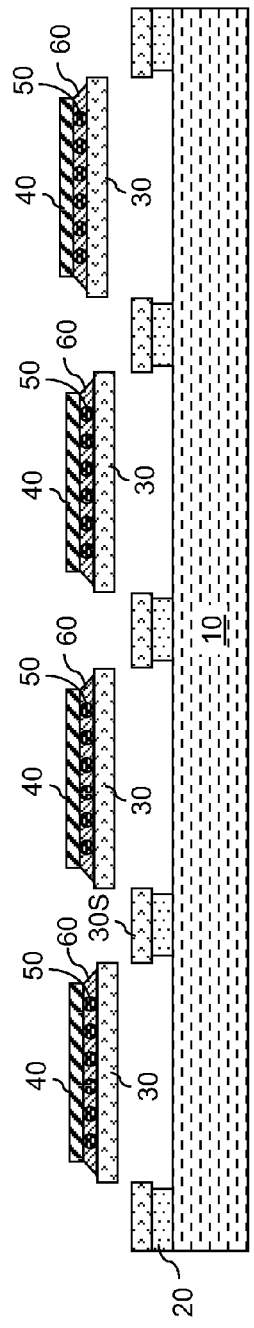
FIG. 7 is a vertical cross-sectional view of the first exemplary structure after dicing bonded stacks of a semiconductor chip and a coreless substrate employing a second dicing method.

Referring to FIG. 7, bonded stacks of a chip 40 and an underlying coreless substrate 30 as shown in FIG. 5 can be diced employing a second dicing method. In the second dicing method, the stiffener 10 is not diced during the dicing of the coreless substrate layer 30L. In the same manner as in the first dicing method, the first exemplary structure of FIG. 5 is diced such that the plane of the dicing channel intersects the cavities in the patterned adhesive layer 20. However, the height of a blade is controlled to prevent cutting of the stiffener 10. Specifically, the coreless substrate layer 30L is diced to isolate at least one bonded stack (30, 40, 50, 60) of a coreless substrate 30 and a chip 40 along vertical planes that include a closed periphery that does not overlie any area of the patterned adhesive layer 20. As in the first dicing method, each closed periphery that does not overlie any area of the patterned adhesive layer 20 encircles the area of a single bonded stack (30, 40, 50, 60) of a coreless substrate 30 and a chip 40. Upon completion of dicing, no portion of each bonded stack (30, 40, 50, 60) of a coreless substrate 30 and a chip 40 contacts any remaining portion of the patterned adhesive layer 20.

The dicing of the bonded stacks (30, 40, 50, 60) can be performed at a dicing temperature, which can be room temperature between 15 degrees Celsius and 25 degrees Celsius, or can be an elevated temperature or a refrigerated temperature as long as lateral tensile stress is applied to the bonded stacks (30, 40, 50, 60) during the dicing. By selecting the material for the stiffener 10 to provide lateral tensile stress to the coreless substrate layer 30L during the dicing process, each bonded stack (30, 40, 50, 60) is maintained taut during the dicing process. Thus, warpage and bending of the bonded stacks (30, 40, 50, 60) are prevented during the dicing of the plurality of bonded stacks (30, 40, 50, 60).

Figure 8:
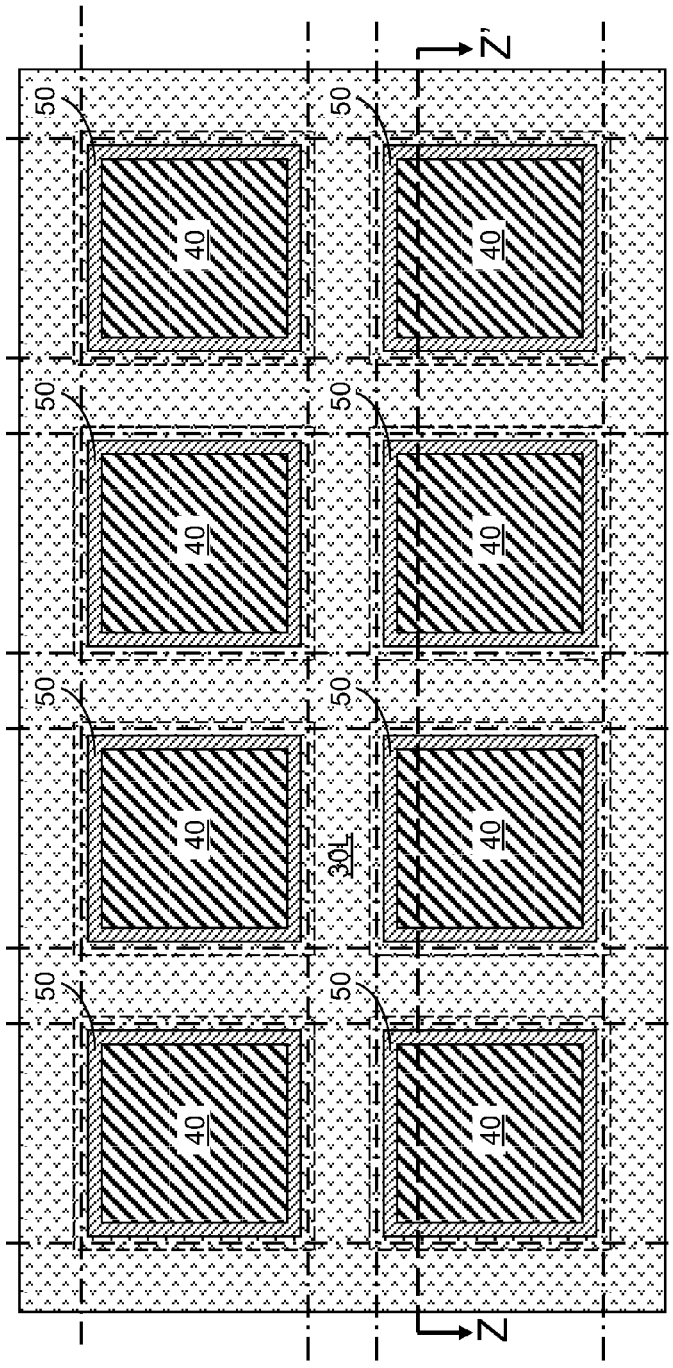
FIG. 8 is a top down view of the first exemplary structure of FIG. 4, in which dicing channels are shown as dashed-and-dotted lines. The plane Z-Z' is the vertical plane for the cross-sectional view of FIG. 5.

Referring to FIG. 8, a top down view of the first exemplary structure of FIG. 5 shows the dicing channels in dotted dashed lines. The area of each cavity is shown as dashed rectangles. The area of the patterned adhesive layer 20 is confined within the kerf area of the coreless substrate layer 30L, and is located outside the area of the bonded stacks that include chips 40, the underfill 60, the C4 balls (See FIG. 5), and the coreless substrates 30 (See FIG. 5). Thus, a rectangle, formed around a bonded stack (30, 40, 50, 60) along portions of two adjacent dicing channels in the direction in FIG. 8 and along portions of two dicing channels along the vertical direction in FIG. 8, forms a closed periphery that does not overlie any area of the patterned adhesive layer 20 as discussed above.

Figure 9:
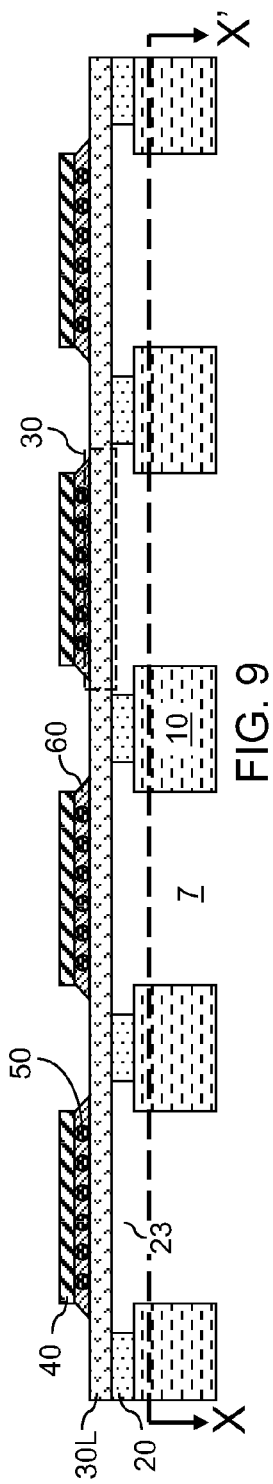
FIG. 9 is a vertical cross-sectional view of a second exemplary structure at a processing step equivalent to the processing step of FIG. 5. The plane X-X' is a plane of the horizontal cross-sectional view of FIG. 10.
Figure 10:
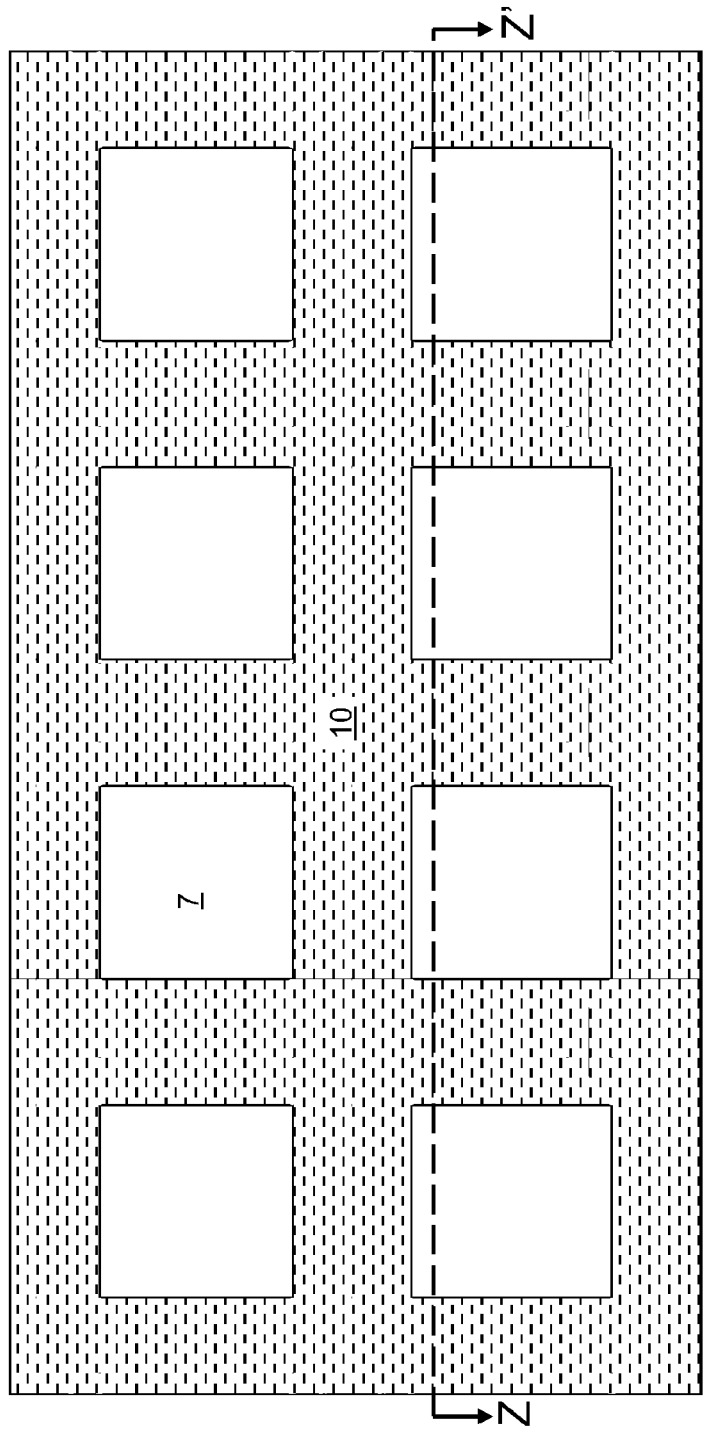
FIG. 10 is a horizontal cross-sectional view of the second exemplary structure of FIG. 9. The plane Z-Z' is a plane of the vertical cross-sectional view of FIG. 9.

Referring to FIGS. 9 and 10, a second exemplary structure can be derived from the first exemplary structure by substituting a stiffener 10 including a plurality of through holes 7 for the stiffener 10 in the first exemplary structure of FIGS. 1-5 and 8 that does not include any through holes. In the second exemplary structure, the plurality of through holes 7 in the stiffener 10 is formed such that each of the plurality of chips 40 overlies a single through hole 7. At a step corresponding to FIG. 4 or FIG. 5, the electrical contact between a chip 40 and the underlying coreless substrate 30 in a bonded stack (30, 40, 50, 60) can be tested by contacting the back side of that coreless substrate 30 with a tester probe through the through hole 7 located directly underneath the bonded stack (30, 40, 50, 60).

Figure 11:
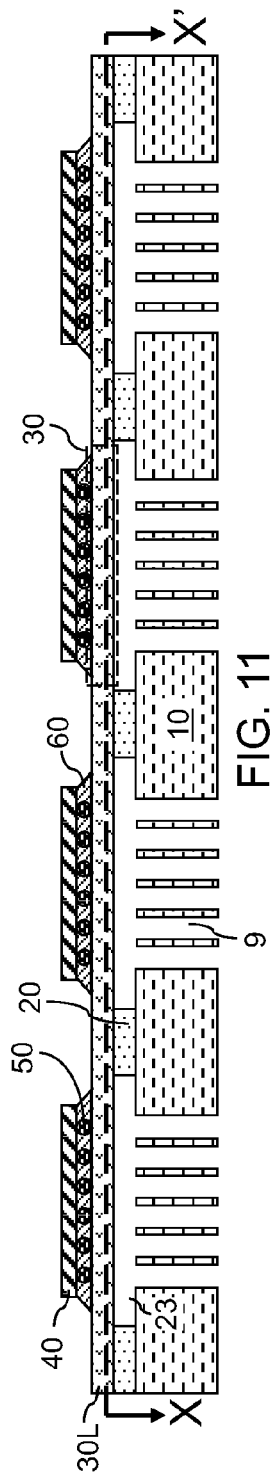
FIG. 11 is a vertical cross-sectional view of a third exemplary structure at a processing step equivalent to the processing step of FIG. 5. The plane X-X' is a plane of the horizontal cross-sectional view of FIG. 12.
Figure 12:
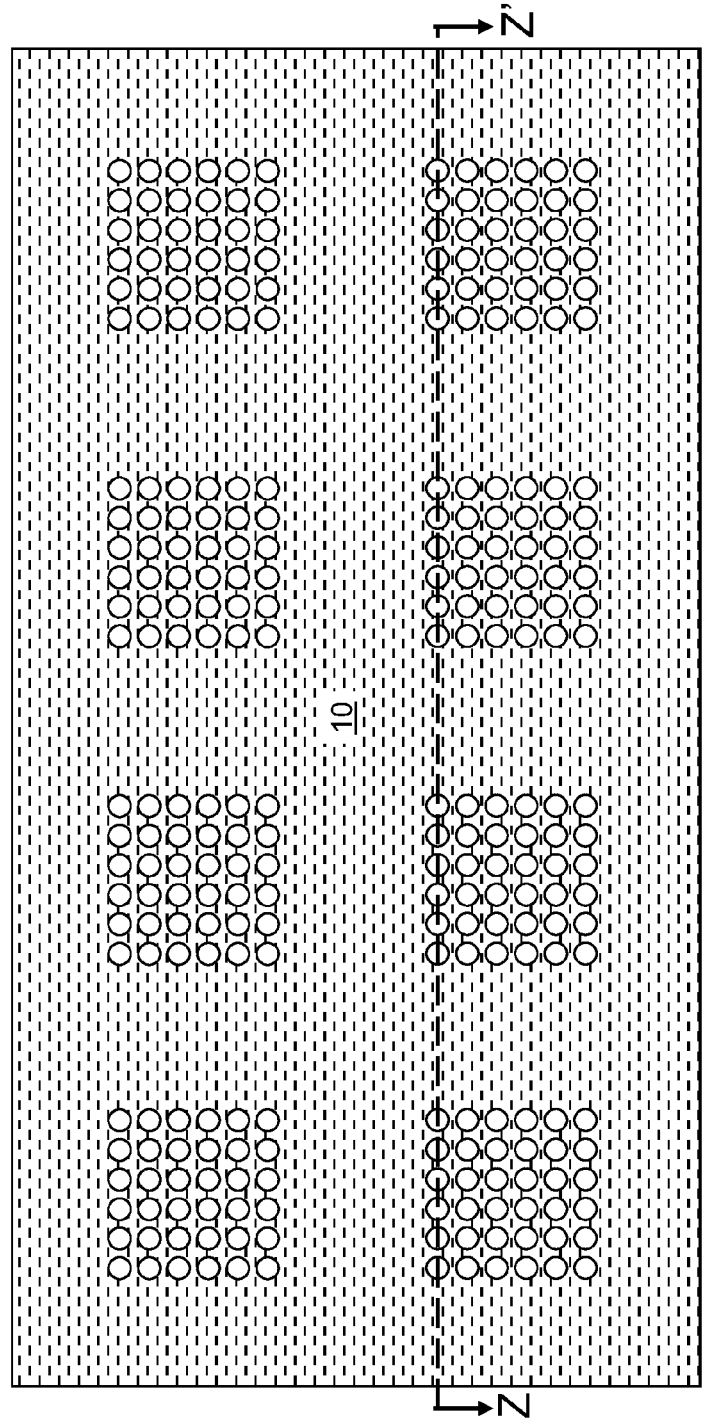
FIG. 12 is a horizontal cross-sectional view of the third exemplary structure of FIG. 11. The plane Z-Z' is a plane of the vertical cross-sectional view of FIG. 11.

Referring to FIGS. 11 and 12, a third exemplary structure can be derived from the first exemplary structure by substituting a stiffener 10 including a plurality of through holes 9 for the stiffener 10 in the first exemplary structure of FIGS. 1-5 and 8 that does not include any through holes. In the third exemplary structure, the plurality of through holes 9 in the stiffener 10 is formed such that each of the plurality of chips 40 overlies multiple through holes 9. The number of the multiple through holes 9 may be the same as the total number of bonding pads (not shown) on the back side of each coreless substrate 30, or may be less than the total number to bonding pads on the back side of each coreless substrate 30. At a step corresponding to FIG. 4 or FIG. 5, the electrical contact between a chip 40 and the underlying coreless substrate 30 in a bonded stack (30, 40, 50, 60) can be tested by contacting the back side of that coreless substrate 30 with a tester probe through the multiple through holes 9 located directly underneath the bonded stack (30, 40, 50, 60).

Figure 13:
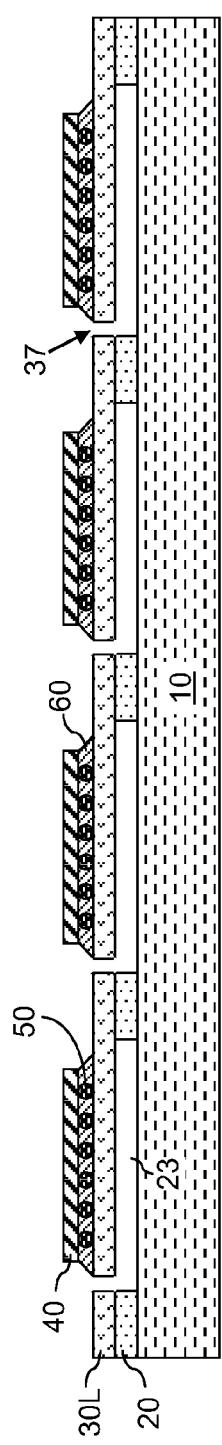
FIG. 13 is a vertical cross-sectional view of a fourth exemplary structure at a processing step equivalent to the processing step of FIG. 5.
Figure 14:
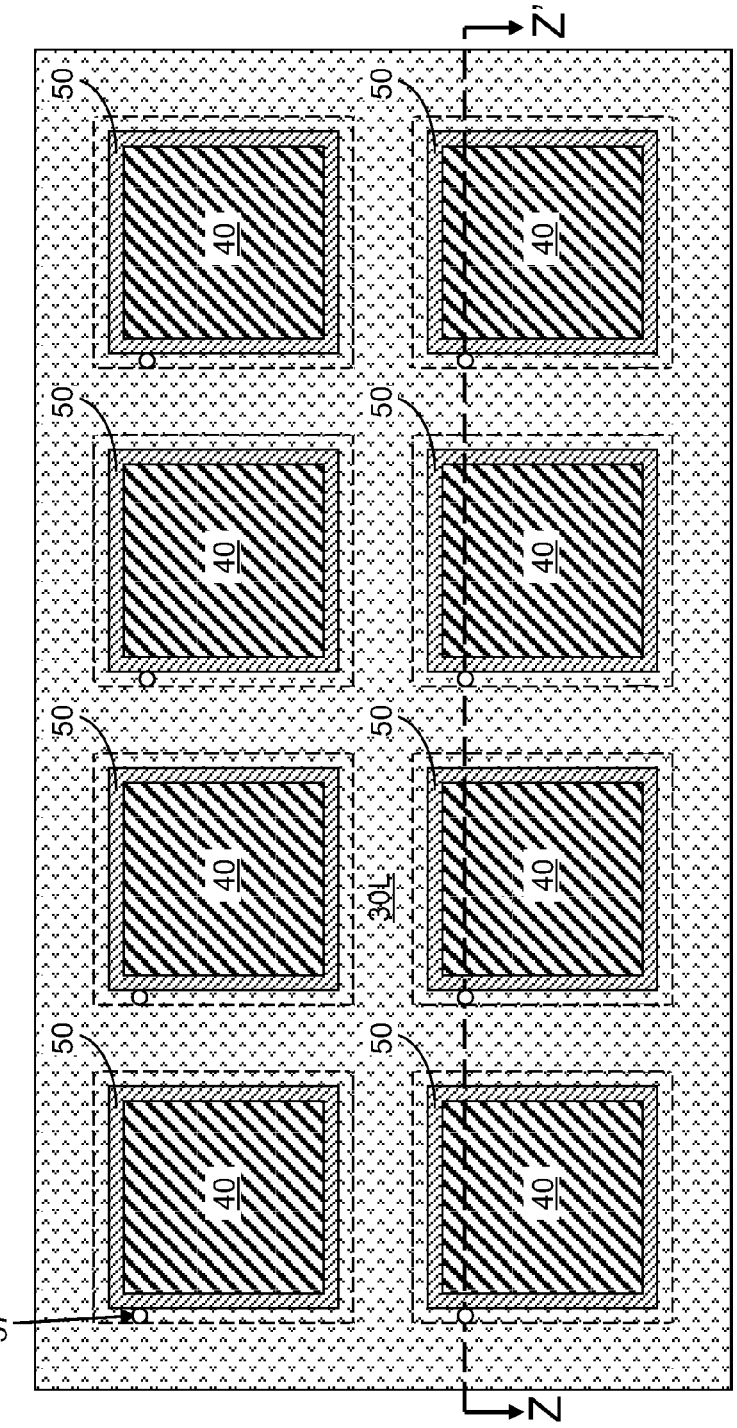
FIG. 14 is a top-down view of the fourth exemplary structure of FIG. 13. The plane Z-Z' is a plane of the vertical cross-sectional view of FIG. 13.

Referring to FIGS. 13 and 14, a fourth exemplary structure can be derived from the first exemplary structure by substituting a coreless substrate layer 30 including a plurality of through holes 37 therein for the coreless substrate layer 30 in the first exemplary structure of FIGS. 1-5 and 8. At least one chip 40 can be aligned to the coreless substrate layer 30L during the bonding step employing the plurality of through holes 37 as alignment marks. The plurality of through holes 37 prevents the cavities underneath each bonded stack (30, 40, 50, 60) from becoming a sealed cavity, and provides paths for venting and air-intake during temperature cycling so that the pressure in the unsealed cavities remains equalized with the ambient pressure.

Referring to FIGS. 15 and 16, a fifth exemplary structure can be derived from the first exemplary structure by substituting a stiffener 10 including a plurality of through holes 17 therein for the stiffener 10 in the first exemplary structure of FIGS. 1-5 and 8. The patterned adhesive layer 20 can be aligned to the stiffener 10 employing the plurality of through holes 17 as alignment marks. The plurality of through holes 17 prevents the cavities underneath each bonded stack (30, 40, 50, 60) from becoming a sealed cavity, and provides paths for venting and air-intake during temperature cycling so that the pressure in the unsealed cavities remains equalized with the ambient pressure.

Figure 17:
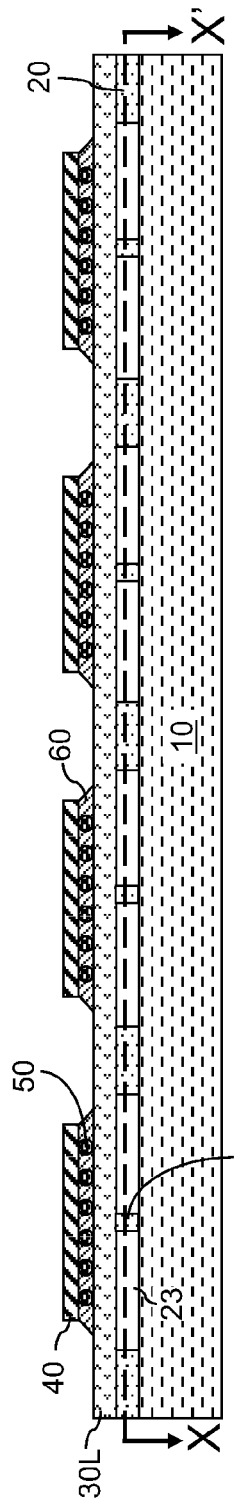
FIG. 17 is a vertical cross-sectional view of a sixth exemplary structure at a processing step equivalent to the processing step of FIG. 5. The plane X-X' is a plane of the horizontal cross-sectional view of FIG. 18.
Figure 18:
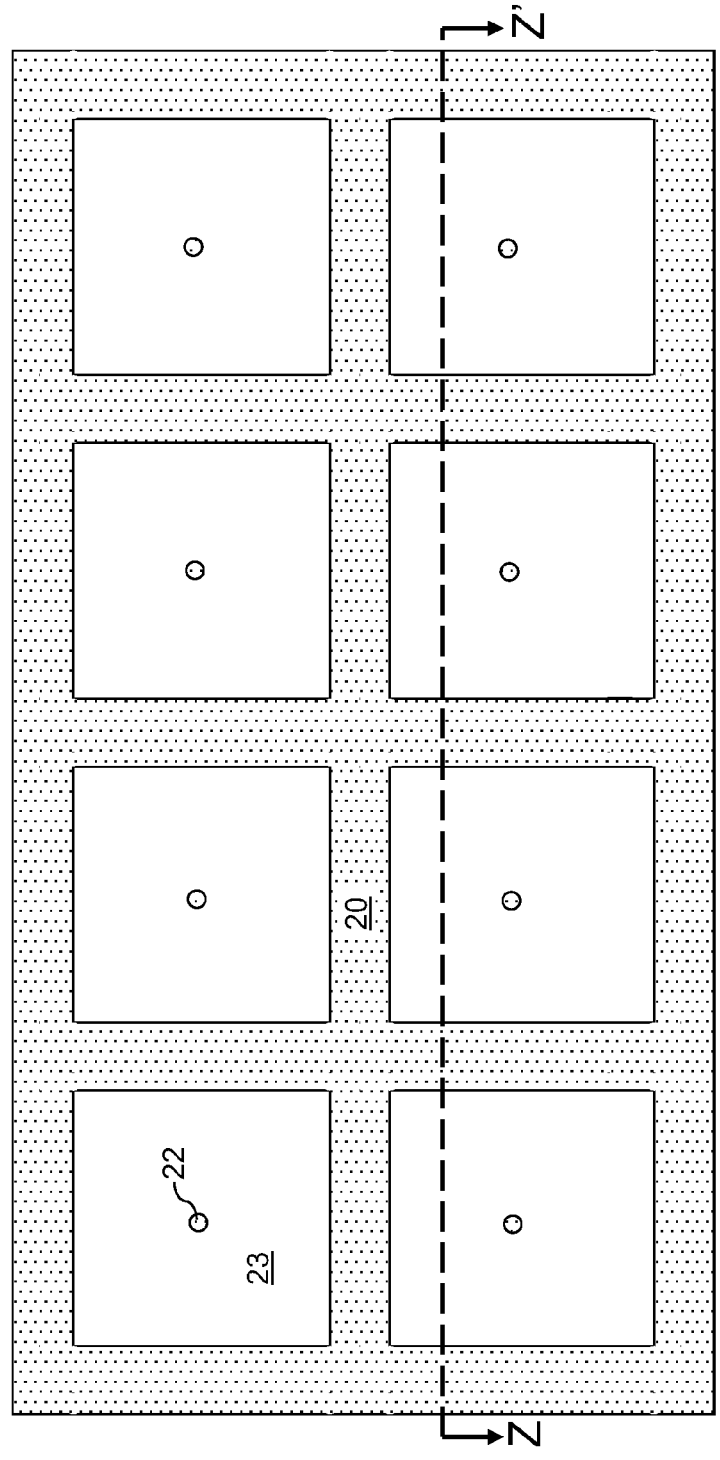
FIG. 18 is a horizontal cross-sectional view of the sixth exemplary structure of FIG. 17. The plane Z-Z' is a plane of the vertical cross-sectional view of FIG. 17.

Referring to FIGS. 17 and 18, a sixth exemplary structure can be derived from the first exemplary structure by forming adhesive support portions 22 in the middle of each hole 23 in the patterned adhesive layer 20 at a processing step corresponding to FIG. 1, i.e., prior to forming the assembly of the stiffener 10, the patterned adhesive layer 20, and the coreless substrate layer 30L shown in FIG. 2. The lateral dimensions, e.g., the diameter if circular or the lengths of sides if rectangular, of each adhesive support portion 22 are typically limited to be less than 10% of the lateral dimensions of the chips 40. The adhesive support portions 22 have substantially the same thickness as the patterned adhesive layer 20, and include an ultraviolet curable adhesive material. The adhesive support portions 22 are formed by applying the ultraviolet curable adhesive material on the top surface (front side surface) of the stiffener 10 and completely curing the applied portions of the ultraviolet curable adhesive material by local ultraviolet radiation without complete curing of the patterned adhesive layer 20.

Subsequently, the assembly of the stiffener 10, the patterned adhesive layer 20, and the coreless substrate layer 30L is formed as shown in FIG. 2. The adhesive support portions 22 do not permanently adhere to the back side of the coreless substrate layer 30L because the curing of the adhesive support portion 22 is complete prior to formation of the assembly (10, 20, 30) of FIG. 2. The adhesive support portions 22 provide mechanical support to the back side of each coreless substrate 30 during bonding of chips 40 in a processing step corresponding to FIG. 4 and during formation of the underfill in a processing step corresponding to FIG. 5. The sixth exemplary structure of FIGS. 17 and 18 corresponds to the processing step of FIG. 5. Each adhesive support portion 22 contacts a portion of the back side surface of the coreless substrate layer 30L and a portion of the top surface of the stiffener 10, but does not contact the patterned adhesive layer 20. Each adhesive support portion 22 is permanently attached to a portion of the top surface of the stiffener 10, but is not permanently attached to a portion of the back side surface of the coreless substrate layer 30L. In some embodiments, a plurality of adhesive support portions 22 can be formed in the same cavity to more effectively support the mass of the overlying coreless substrate 30. In general, the adhesive support portions 22 become more effective as the lateral dimensions of the chips 40 increase.

Figure 19:
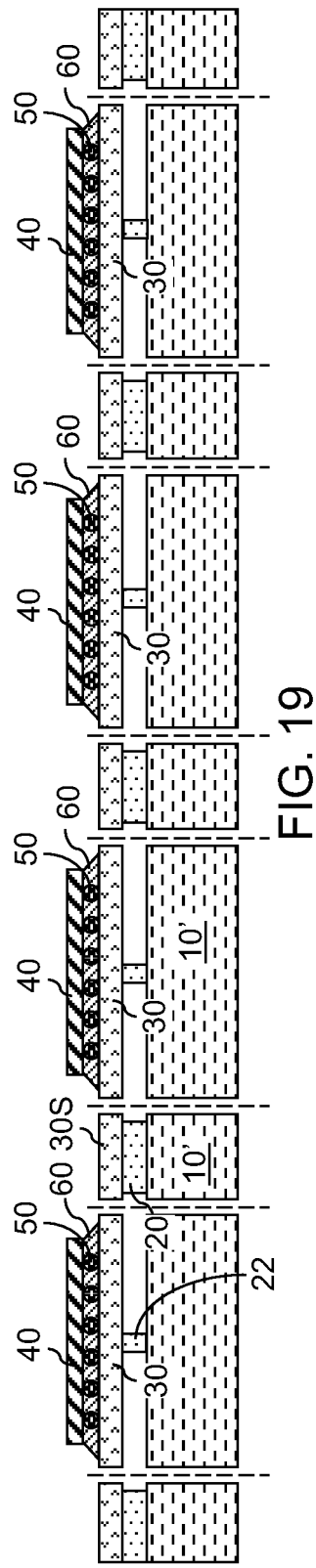
FIG. 19 is a horizontal cross-sectional view of the sixth exemplary structure after dicing bonded stacks of a semiconductor chip and a coreless substrate.

Referring to FIG. 19, bonded stacks of a chip 40 and an underlying coreless substrate 30 as shown in FIGS. 17 and 18 are diced in a singulation process. The coreless substrate layer 30 and the stiffener 10 are cut in the same dicing process along the same dicing channels. As in the dicing of the first exemplary structure in FIG. 6, the sixth exemplary structure is diced such that the plane of the dicing channel intersects the cavities in the patterned adhesive layer 20. The adhesive support portions 22 provide mechanical support to the back side of each bonded stack (30, 40, 50, 60) during the dicing process. The stiffener 10 is diced in the same pattern as the pattern of cuts made in the coreless substrate layer 30L. Specifically, the coreless substrate layer 30L and the stiffener 10 are diced to isolate at least one structural stack that includes a bonded stack (30, 40, 50, 60) of a coreless substrate 30 and a chip 40, an adhesive support portion 22 (or a plurality of adhesive support portions 22), and an underlying stiffener portion 10' along vertical planes that include a closed periphery that does not overlie any area of the patterned adhesive layer 20. Each closed periphery that does not overlie any area of the patterned adhesive layer 20 encircles the area of a single bonded stack (30, 40, 50, 60) of a coreless substrate 30 and a chip 40. Upon completion of dicing, no portion of each bonded stack (30, 40, 50, 60) of a coreless substrate 30 and a chip 40 contacts any remaining portion of the patterned adhesive layer 20.

The dicing of the bonded stacks (30, 40, 50, 60) can be performed at a dicing temperature, which can be room temperature between 15 degrees Celsius and 25 degrees Celsius, or can be an elevated temperature or a refrigerated temperature as long as lateral tensile stress is applied to the bonded stacks (30, 40, 50, 60) during the dicing. By selecting the material for the stiffener 10 to provide lateral tensile stress to the coreless substrate layer 30L during the dicing process, each bonded stack (30, 40, 50, 60) is maintained taut during the dicing process. Thus, warpage and bending of the bonded stacks (30, 40, 50, 60) are prevented during the dicing of the plurality of bonded stacks (30, 40, 50, 60).

Figure 20:
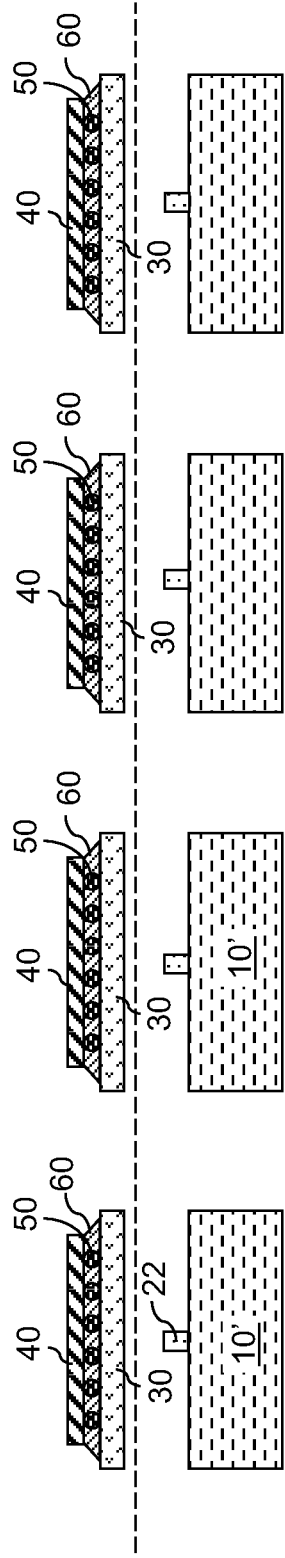
FIG. 20 is a horizontal cross-sectional view of the sixth exemplary structure after removing stiffener portions and adhesive support portions.

Referring to FIG. 20, is stiffener portions 10' and adhesive support portions 22 are removed from the overlying bonded stack (30, 40, 50, 60) by applying torque or shear stress. Because the top surfaces of the adhesive support portions 22 are not bonded (permanently attached) to the bottom surface of the overlying bonded stack (30, 40, 50, 60), the adhesive support portions 22 can be removed without applying excessive force or subjecting the overlying bonded stack (30, 40, 50, 60) to a significant risk of bending or warpage.

Figure 21:
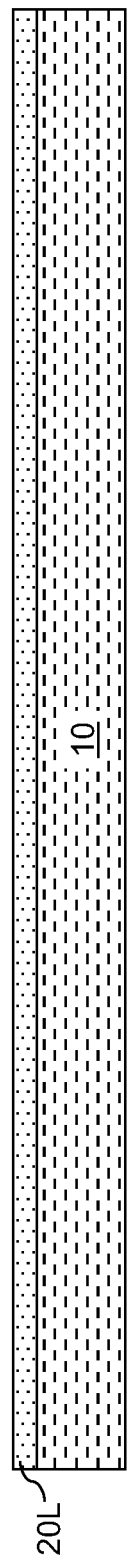
FIG. 21 is a preparatory exemplary structure including a stack of a stiffener and an unpatterned adhesive layer.
Figure 22:
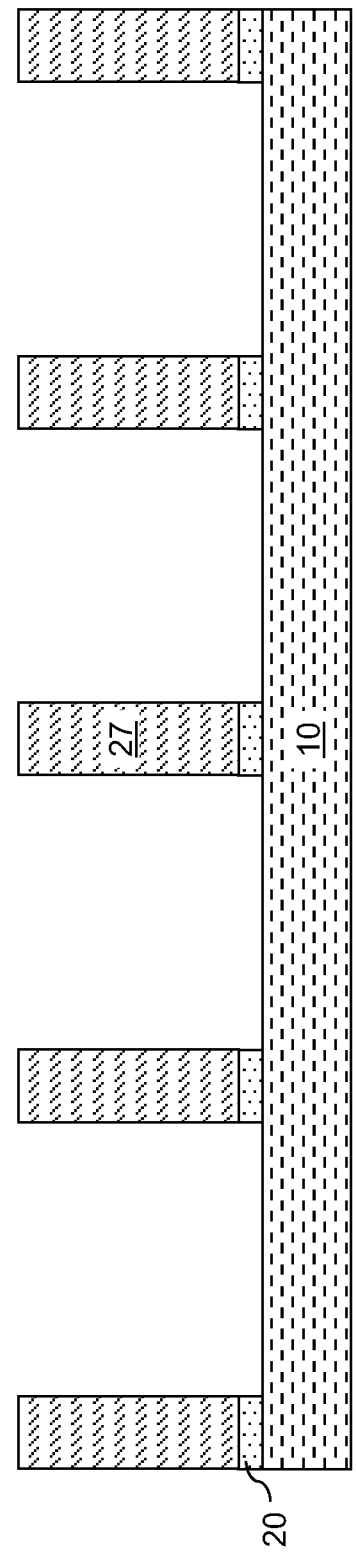
FIG. 22 is the preparatory exemplary structure after application and patterning of a photoresist and transfer of the pattern in the photoresist into the unpatterned adhesive layer to form a patterned adhesive layer.
Figure 23:
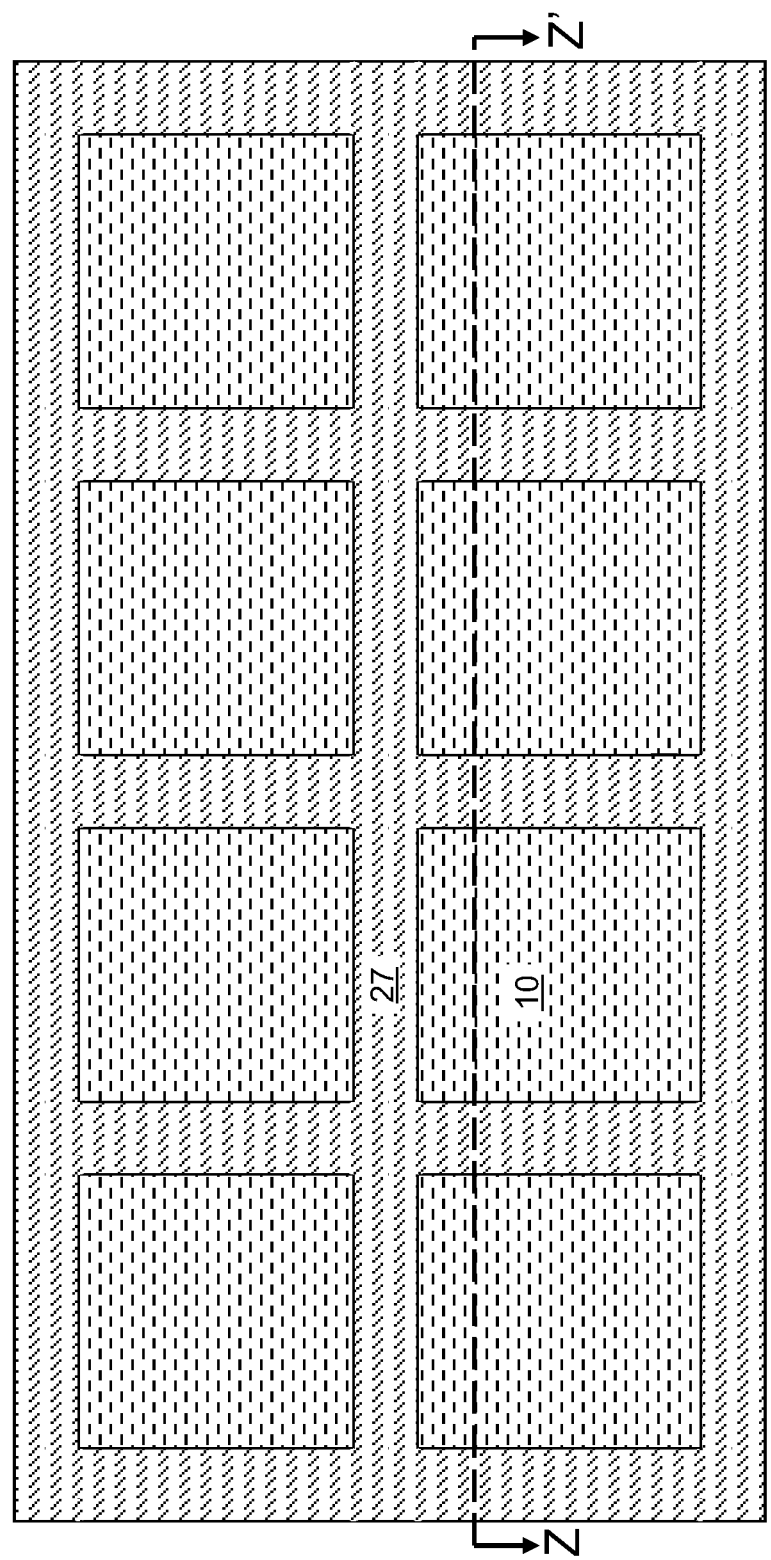
FIG. 23 is a top-down view of the preparatory exemplary structure of FIG. 22.

Referring to FIGS. 21-23, a method of forming a patterned adhesive layer 20 on a stiffener 10 is illustrated employing a preparatory exemplary structure. Referring to FIG. 21, the preparatory exemplary structure includes a stack of a stiffener 10 and a blanket (unpatterned) adhesive layer 20L. The blanket adhesive layer 20L is applied to the front side of the stiffener 10 to cover the entirety of the front side of the stiffener 10. Alternately, the blanket adhesive layer 20L can be applied to the back side of the coreless substrate layer 30L of FIG. 1.

Referring to FIGS. 22 and 23, a photoresist 27 is applied to the exposed surface of the blanket adhesive layer 20L and is lithographically patterned to form a pattern identical to the pattern shown in FIG. 2 within the photoresist 27. The pattern in the photoresist 27 is subsequently transferred into the blanket adhesive layer 20L by a wet etch or a dry etch that removes the exposed portions of the blanket adhesive layer 20L. The remaining portions of the blanket adhesive layer 20L constitutes the patterned adhesive layer 20 in FIG. 1. The photoresist 27 is subsequently removed selective to the patterned adhesive layer 20. Optionally, the exposed portions of the blanket adhesive layer 20L may be irradiated with electromagnetic radiation to reduce the adhesive properties of the irradiated portions. The irradiated portions of the blanket adhesive layer 20L is subsequently removed, and the remaining portions of the blanket adhesive layer 20L form the patterned adhesive layer 20, which can be employed in the processing step of FIG. 1.

Optionally, additional processing steps may be included after the processing step of FIGS. 5, 9-10, 11-12, 13-14, 15-16, 17-18, or any equivalent processing step and before any dicing step such as the dicing steps of FIG. 6, 7, or 9.

Figure 24:
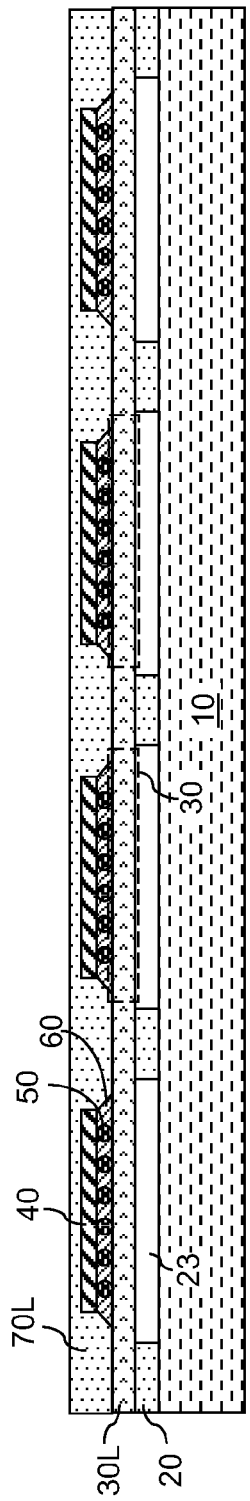
FIG. 24 is a variation of the first exemplary structure after applying an encapsulation layer on the coreless substrate layer and chips.
Figure 25:
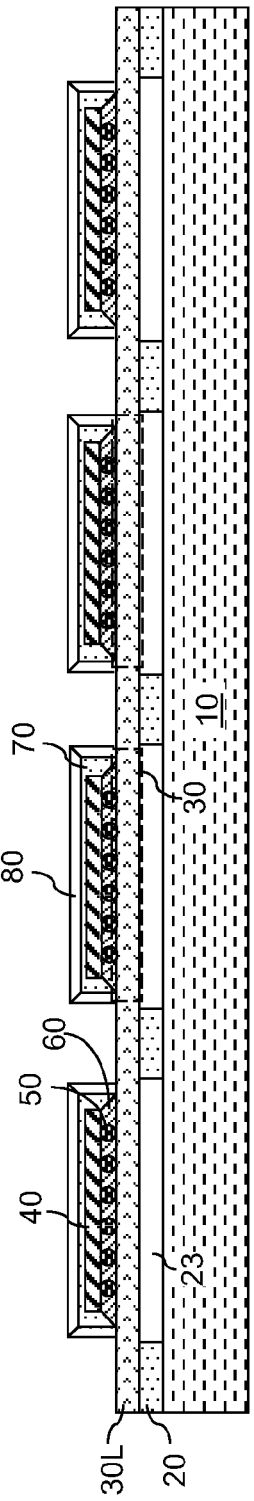
FIG. 25 is a variation of the first exemplary structure after patterning the encapsulation layer and forming lid structures on the chips.
Figure 26:
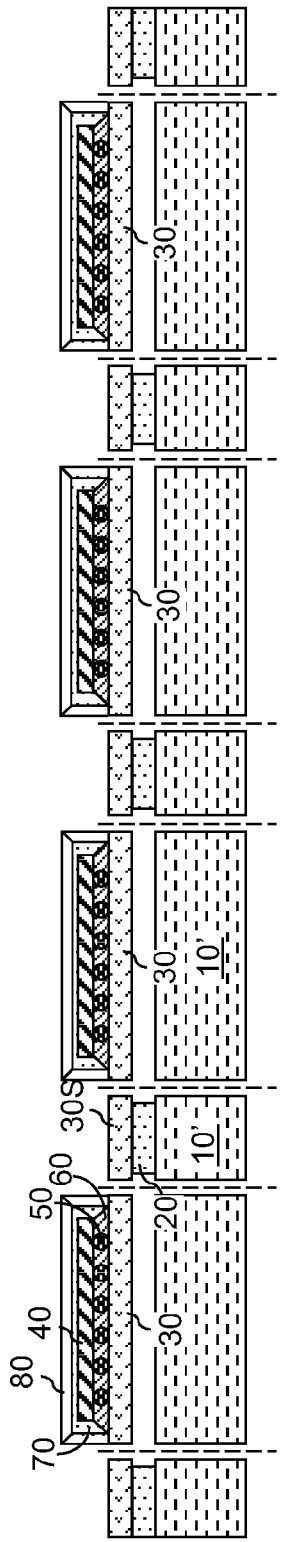
FIG. 26 is a variation of the first exemplary structure after dicing bonded stacks of a semiconductor chip and a coreless substrate employing a first dicing method.

FIGS. 24-26 illustrate such optional additional processing steps that may be performed in combination with the processing steps described above.

Referring to FIG. 24, a variation of the first exemplary structure is derived from the first exemplary structure of FIG. 5 by applying an encapsulation layer 70L on the coreless substrate layer 30L and chips 40. The encapsulation layer 70L includes a dielectric material. Preferably, the encapsulation layer 70L includes a thermally conductive dielectric material to facilitate heat transfer from the chips 40 to the ambient. The top surface of the encapsulation layer 70L can be coplanar with the top surfaces of the chips 40, or can be located above the top surfaces of the chips 40.

Referring to FIG. 25, the encapsulation layer 70L is patterned to form encapsulation material portions 70, each of which laterally surrounds a chip 40. A lid structure 80 is formed on each encapsulation material portion such that each chip 40 is completely encapsulated by the lid structure 80 and a coreless substrate 30 located directly underneath. The lid structure 30 protects the chip from mechanical stress and ingress of moisture and contaminants. The top surfaces of a chip 40 may contact an inside surface of the lid structures 30 if the top surface of the encapsulation material portion 70 thereabout is coplanar with the top surface of the chip 40. The top surfaces of a chip 40 may contact a top surface of an encapsulation material portion 70 if the top surface of the encapsulation material portion 70 is raised above the top surface of the chip 40.

Referring to FIG. 26, the bonded stacks of a semiconductor chip and a coreless substrate can be diced employing any of the dicing methods described above.

While the drawings of the present disclosure illustrates a coreless substrate layer 30L including a plurality of coreless substrates 30, the methods of the present disclosure can be employed for a coreless substrate layer 30L including a single coreless substrate 30. Such an application can be useful in cases where design, manufacturing equipment, or manufacturing processes cannot accommodate the methods of the present disclosure for a coreless substrate layer 30l.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a bonded stack of a coreless substrate and a chip, said method comprising:
   forming a stack, from bottom to top, of a stiffener, a patterned adhesive layer, and a coreless substrate layer including at least one coreless substrate integrally incorporated therein, wherein said patterned adhesive layer includes a plurality of holes therein;
   bonding at least one chip to said at least one coreless substrate;
   dicing said coreless substrate layer to isolate at least one bonded stack of a coreless substrate and a chip along vertical planes that include a closed periphery that does not overlie any area of said patterned adhesive layer;
   applying a blanket adhesive layer to a front side of said stiffener; and
   applying a photoresist to said blanket adhesive layer and lithographically patterning said photoresist.

2. The method of claim 1, wherein said stiffener is diced in a same dicing process as said coreless substrate layer.

3. A method of forming a bonded stack of a coreless substrate and a chip, said method comprising:
   forming a stack, from bottom to top, of a stiffener, a patterned adhesive layer, and a coreless substrate layer including at least one coreless substrate integrally incorporated therein, wherein said patterned adhesive layer includes a plurality of holes therein;
   bonding at least one chip to said at least one coreless substrate; and
   dicing said coreless substrate layer to isolate at least one bonded stack of a coreless substrate and a chip along vertical planes that include a closed periphery that does not overlie any area of said patterned adhesive layer, wherein said stiffener is not diced during said dicing of said coreless substrate layer.

4. The method of claim 1, wherein said stiffener includes a plurality of through holes therein, and said method further includes testing electrical contact between said at least one chip and said at least one coreless substrate by contacting a back side of said at least one coreless substrate through one of said plurality of through holes.

5. The method of claim 1, further comprising forming a plurality of through holes in said coreless substrate layer, wherein said at least one chip is aligned to said coreless substrate layer during said bonding employing said plurality of through holes as alignment marks.

6. The method of claim 1, further comprising forming a plurality of through holes in said stiffener, wherein said patterned adhesive layer is aligned to said stiffener employing said plurality of through holes as alignment marks.

7. A method of forming a bonded stack of a coreless substrate and a chip, said method comprising:
   forming a stack, from bottom to top, of a stiffener, a patterned adhesive layer, and a coreless substrate layer including at least one coreless substrate integrally incorporated therein, wherein said patterned adhesive layer includes a plurality of holes therein;
   bonding at least one chip to said at least one coreless substrate;
   dicing said coreless substrate layer to isolate at least one bonded stack of a coreless substrate and a chip along vertical planes that include a closed periphery that does not overlie any area of said patterned adhesive layer;
   applying a blanket adhesive layer to a back side surface of said coreless substrate layer; and
   applying a photoresist to said blanket adhesive layer and lithographically patterning said photoresist.

8. The method of claim 1, wherein bonding said at least one chip to said at least one coreless substrate comprises using C4 balls.

9. The method of claim 1, wherein said stiffener applies lateral tensile stress to said coreless substrate layer at least at room temperature and at a temperature selected from a range between 210 degrees Celsius and 300 degrees Celsius.

10. The method of claim 1, wherein said patterned adhesive layer includes a thermally cured adhesive material, an ultraviolet cured adhesive material, or a combination thereof.

11. The method of claim 1, wherein said stiffener is composed of a material having a glass transition temperature between 150 degrees Celsius and 210 degrees Celsius.

12. The method of claim 9, wherein said stiffener is composed of a material having a first temperature-dependent coefficient of thermal expansion that is greater than a second temperature-dependent coefficient of thermal expansion of said coreless substrate above a cross-over temperature and is less than said second temperature-dependent coefficient of thermal expansion below said cross-over temperature, wherein said cross-over temperature is between 150 degrees Celsius and 210 degrees Celsius.

13. The method of claim 12, wherein said stiffener is composed of epoxy resin or polyimide.

14. The method of claim 1, wherein said coreless substrate layer and said stiffener are vertically spaced from each other by said patterned adhesive layer.

15. The method of claim 14, wherein a vertical distance between said coreless substrate layer and said stiffener is the same as a thickness of said patterned adhesive layer.

16. The method of claim 1, wherein said patterned adhesive layer and said plurality of chips are vertically spaced from each other by said coreless substrate layer.

17. The method of claim 16, wherein a vertical distance between said patterned adhesive layer and said plurality of chips is the same as a thickness of said coreless substrate layer.

* * * * *